(12) United States Patent
Ehm et al.

(10) Patent No.: US 7,671,347 B2
(45) Date of Patent: Mar. 2, 2010

(54) CLEANING METHOD, APPARATUS AND CLEANING SYSTEM

(75) Inventors: Dirk Heinrich Ehm, Aalen (DE); Johannes Hubertus Josephina Moors, Helmond (NL); Bastiaan Theodoor Wolschrijn, Abcoude (NL); Marcus Gerhardus Hendrikus Meijerink, The Hague (NL); Thomas Stein, Oberkochen (DE)

(73) Assignees: ASML Netherlands B.V., Veldhoven (NL); Carl Zeiss SMT AG, Oberkochen (DE)

( * ) Notice: Subject to any disclaimer, the term of this patent is extended or adjusted under 35 U.S.C. 154(b) by 500 days.

(21) Appl. No.: 11/544,931

(22) Filed: Oct. 10, 2006

(65) Prior Publication Data
US 2008/0083878 A1    Apr. 10, 2008

(51) Int. Cl.
*G21K 5/00* (2006.01)
(52) U.S. Cl. .............................. 250/492.2; 250/492.22

(58) Field of Classification Search ................. 250/372, 250/492.1, 492.2, 492.22
See application file for complete search history.

(56) References Cited

FOREIGN PATENT DOCUMENTS
EP          1431830 A2  *  6/2004

* cited by examiner

*Primary Examiner*—David P Porta
*Assistant Examiner*—Mark R Gaworecki
(74) *Attorney, Agent, or Firm*—Pillsbury Winthrop Shaw Pittman LLP (57) ABSTRACT

A method to clean optical elements of an apparatus, the apparatus being configured to project a beam of radiation onto a target portion of a substrate, the apparatus comprising a plurality of optical elements arranged in sequence in the path of the radiation beam, wherein the cleaning method comprises: cleaning one or more second optical elements of the sequence, which receive one or more relatively low second radiation doses during operation of the apparatus, utilizing cumulatively shorter cleaning periods than one or more first optical elements of the sequence that receive one or more first radiation doses during operation of the apparatus, a second radiation dose being lower than each relatively high first radiation dose.

25 Claims, 4 Drawing Sheets

CLEANING METHOD, APPARATUS AND CLEANING SYSTEM

FIELD

The invention relates to a cleaning method, an apparatus and a cleaning system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Optical element surfaces (e.g. in Extreme Ultraviolet (EUV) lithography apparatus) may suffer from contamination growth (e.g. carbonization) during apparatus operation. Such contamination may be introduced by the environment of the optical surfaces (e.g. vacuum environment, resist, radiation source, etc.). In an EUV lithography apparatus, multi-layer mirrors typically provide these optical surfaces. To get rid of such contamination, cleaning of components is required. An example cleaning method is based on cleaning mirrors, in the optical path, with atomic hydrogen produced by, for example, a hot filament.

SUMMARY

According to an embodiment, there is provided a method to clean one or more optical elements of an apparatus, the apparatus being configured to project a beam of radiation onto a target portion of a substrate and comprising a plurality of optical elements arranged in a sequence in a path of the radiation beam, wherein the method comprises cleaning a second optical element of the sequence, which receives a second radiation dose during operation of the apparatus, utilizing a cumulatively shorter cleaning period than a first optical element of the sequence, which receives a first radiation dose during operation of the apparatus, the second radiation dose being lower than the first radiation dose.

According to an embodiment, there is provided a device manufacturing method, comprising:

projecting a beam of radiation onto a target portion of a substrate utilizing a sequence of optical elements, wherein the optical elements receive different radiation doses and the contamination rates of the optical elements are correlated with the radiation doses;

executing a number of cleaning cycles to clean at least one of the optical elements, each cleaning cycle involving cleaning an optical element of the sequence based on the radiation dose received by the optical element, so that an optical element that has received a low radiation dose is cleaned during a shorter time period or less often than an optical element that has received a radiation dose that is higher than the low radiation dose.

According to an embodiment, there is provided an apparatus, comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and a cleaning system configured to clean one or more optical elements of the apparatus, the cleaning system being configured to clean an optical element of the projection system during a cumulatively shorter cleaning period than an optical elements of the illumination system.

According to an embodiment, there is provided a cleaning system adapted to clean one or more optical elements of an apparatus, the optical elements being arranged in a path of a radiation beam used during a process carried out by the apparatus, wherein the cleaning system is configured to clean only one or some of the optical elements that are arranged in the path of the radiation beam, depending on the amount of radiation received by each of such elements during the process.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
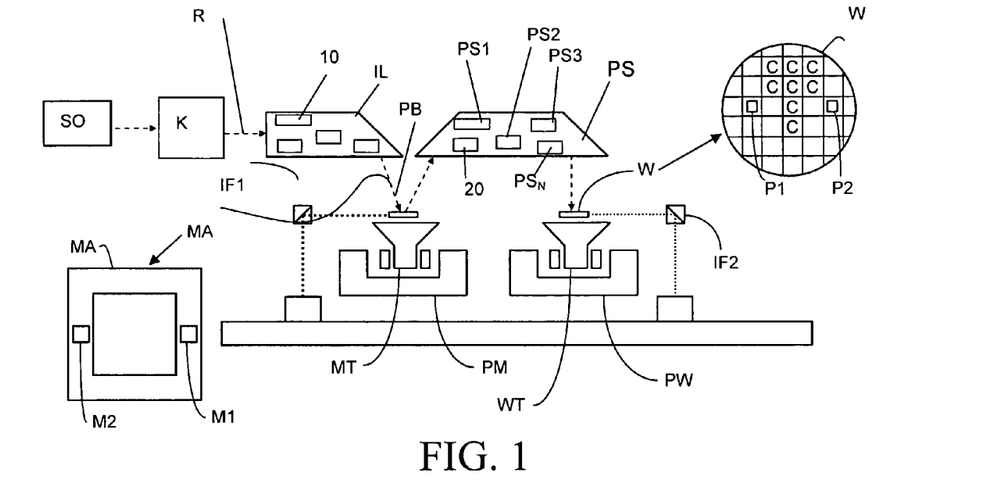
FIG. 1 depicts an embodiment of a lithographic apparatus.
Figure 2:
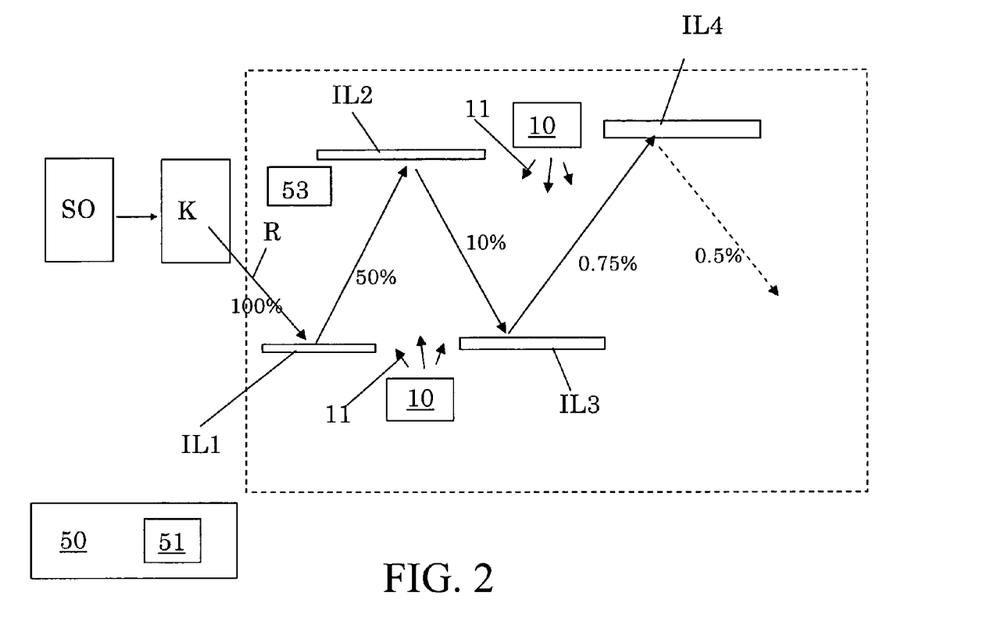
FIG. 2 schematically depicts an embodiment of a sequence of optical elements, and part of a cleaning system.

FIG. 1 schematically depicts a lithographic apparatus according to one embodiment of the invention. FIG. 2 depicts a further embodiment thereof. The apparatus comprises:

an illumination system (illuminator) IL configured to condition a radiation beam PB (e.g. UV radiation, particularly substantially comprising EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam PB by patterning device MA onto a target portion C (e.g. comprising one or more dies) of the substrate W. Various optical elements PS1, PS2, PS3, . . . , $PS_N$ (the projection system comprising N optical elements) are schematically indicated in FIG. 1. For example, the projection system optical elements may comprise a plurality of mirrors PS1, PS2, PS3, . . . , $PS_N$ in an EUV type projection beam lithographic apparatus.

The illumination system may include various types of optical elements, such as refractive, reflective, magnetic, electromagnetic, electrostatic or other types of optical elements, or any combination thereof, for directing, shaping, or controlling radiation. FIG. 2 shows part of an illuminator having a plurality of optical elements IL1, IL2, IL3, IL4. For example, the illumination system may comprise a plurality of mirrors IL1, IL2, IL3, IL4 in an EUV type projection beam lithographic apparatus.

Thus, the apparatus comprises a sequence of optical elements, which elements are arranged in the path of the radiation R, the sequence of optical elements comprising, for example, elements IL1, IL2, IL3, IL4 of the illumination system IL (located upstream viewed from the patterning device MA, with respect to a direction of radiation beam propagation) and elements PS1, PS2, PS3, . . . , $PS_N$ of the projection system (located downstream viewed from the patterning device MA, with respect to a direction of radiation beam propagation).

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system. In an embodiment, the radiation source is a plasma EUV source, for example a tin (Sn) plasma EUV source. For example, in such a radiation source, Sn atoms may be heated (e.g., electrically) using a low power laser. The EUV radiation source may also be a different radiation source, for example a Li or Xe 'fueled' plasma radiation source. Also, during use, small amounts of plasma may escape from the source SO, towards a collector K and the illuminator IL. The collector K may collect radiation R from the radiation source SO. The collector K may be arranged to transmit the collected radiation R to the illumination system IL. Particularly, the collector K may be arranged to focus incoming radiation, received from the radiation source, onto a small focusing area or point. Further, there may be provided one or more debris mitigation systems, for example so called foil traps (not shown as such), located between the source SO and collector K to capture/mitigate debris emanating from the source SO.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam PB is incident on the patterning device (e.g., mask) MA, which is held on the support structure (e.g., mask table) MT, and is patterned by the patterning device. Being reflected by the patterning device MA, the radiation beam PB passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam PB. Similarly, the first positioner PM and another position sensor IF1 can be used to accurately position the patterning device MA with respect to the path of the radiation beam PB, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Generally, all optical elements of a lithographic apparatus may be contaminated over time. Resulting optical losses are undesired and may lead to lower throughput and malfunction of devices manufactured by the apparatus. Thus, the apparatus may be provided with a cleaning system 10, 20, 50 configured to clean one or more optical elements of the apparatus. The cleaning system can be configured in any of various ways. Various suitable cleaning devices as such are known from the prior art, and may be implemented in one or more embodiments of the invention.

As an example, the cleaning system may comprise one or more cleaning units 10, 20, located or positionable in the apparatus to clean one or more optical elements of the apparatus. In FIGS. 1 and 2, for example, a plurality of first cleaning units 10 are provided to clean optical elements IL1-IL4 of the illuminator system IL. Also, one or more cleaning units 20 might be available in the projection system PS to clean optical elements PS1, PS2, PS3, . . . $PS_N$ of the projection system PS. In an embodiment, the optical elements that are to be cleaned by the cleaning system 10, 20, 50 are selected from the sequence of optical elements arranged in the path of the radiation beam R. For example, a cleaning unit 10, 20 may be configured to provide or generate a certain cleaning medium or means (schematically shown by arrows 11 in FIG. 2), for example a cleaning substance, gas, ions, radicals, radiation, particles and/or a different cleaning means, and to effect contact between the cleaning medium/means and an element to be cleaned.

For example, in an embodiment, a cleaning unit 10, 20 may be configured to generate hydrogen radicals (using, for example, a hot filament or an RF field). According to an embodiment, a cleaning unit can be configured to carry out a method, which comprises providing a $H_2$ containing gas in at least part of the apparatus, producing hydrogen radicals 11 from $H_2$ from the $H_2$ containing gas, and having the surface of an optical element IL1-IL4, PS1, . . . $PS_N$ (to be cleaned) come into contact with at least part of the hydrogen radicals 11 and removing at least part of a contamination deposition from that surface. As an example, the mentioned deposition may comprise one or more elements selected from B, C, Si, Ge and Sn. Also, at least part of the hydrogen radicals 11 may be generated from $H_2$ from the $H_2$ containing gas by a filament, a plasma, radiation, or a catalyst configured to convert $H_2$ into hydrogen radicals. Moreover, the $H_2$ containing gas may further comprises a halogen gas. However, it will be appreciated by the skilled person that a cleaning unit may be configured to operate in a different manner.

In an embodiment, there may be provided a controller 50 configured to control the cleaning system, for example to activate and deactivate one or more cleaning units 10, 20. The controller 50 (which is schematically depicted in FIG. 2) may be configured in any of various ways, for example comprising suitable hardware, software, a computer, processor, microelectronics, wired and/or wireless communication means to communicate with the cleaning units 10, 20, and/or a memory device 51 to store cleaning process related data, as will be appreciated by the skilled person.

For example, the memory 51 may contain cleaning rates of cleaning processes to be applied to the one or more optical elements. In an embodiment, these cleaning rates may differ, depending on the cleaning processes, the contamination to be removed and the optical element to be cleaned by the respective cleaning processes, as will be appreciated by the skilled person. The cleaning rates may have been determined empirically or in a different manner.

In the apparatus of FIGS. 1 and 2, a first optical element IL1 of the illuminator receives an initial relatively high EUV radiation dose of radiation R from the source/collector assembly (generally, the radiation dose is the radiation power received per surface area of the respective optical element over a certain time period and may be expressed in $mJ/mm^2$). This high initial EUV radiation dose is indicated by '100%' in FIG. 2. In an embodiment, the optical surfaces of the subsequent optical elements IL2-IL4, PS1-$PS_N$ may be substantially fully irradiated by the radiation beam. Also, for example, in the case that the optical elements IL1-IL4, PS1-$PS_N$ are mirrors, mirror reflection losses may mainly cause optical losses along the sequence of optical elements, the optical losses as such leading to reduction of EUV radiation dose downstream along the sequence of elements. Further, in an example, the configuration may be such that there is a spectrum change in the radiation of the radiation beam during operation. For example, a first optical element PS1 of the sequence may receive radiation having a higher EUV spectrum ratio of the overall spectrum than subsequent optical elements of the sequence.

In an embodiment, a majority of the optical elements of the sequence of optical elements receive at most 75% of the EUV radiation dose that has been received by the previous optical element of the sequence of elements (the previous optical element being arranged upstream with respect to the respective element in the sequence). For example, in case of the optical elements IL1-IL4 of the illuminator IL, in an embodiment, each subsequent optical element of the illuminator system IL receives at most 50% of the EUV radiation dose that has been received by the previous optical element of the illuminator system IL. In an embodiment, in the case of the optical elements IL1-IL4 of the illuminator IL, the second optical element IL2 of the illuminator IL receives at most 50% of the initial EUV radiation dose received by the first optical element IL1 of the illuminator IL, the third optical element IL3 of the illuminator IL receives at most 33% of the EUV radiation dose received by the second optical element IL2. Also, for example, the fourth optical element IL4 of the illuminator IL receives less than 10% of the initial EUV radiation dose, particularly less than 1% and more particularly less than 0.5% of the initial radiation dose, received by the first optical element IL1.

Thus, as is indicated in FIG. 2, the second optical element IL2 of the illumination system IL (that is located downstream of the first optical element IL1 of that system IL) may receive a smaller EUV radiation dose than the initial dose of 100% received by the first optical element IL1 of that system. As an example, indicated in FIG. 2, the second optical element IL2 receives 50% of the initial dose, the third optical element IL3 receives 10% of the initial dose and the fourth optical element IL4 receives 0.75% of the initial dose.

In a further embodiment, each optical element PS1-$PS_N$ of the projection system PS receives less than 10% of the above-mentioned initial EUV radiation dose, particularly less than 1% of the initial radiation dose and more particularly less than 0.5% of the initial radiation dose, received by the first optical element IL1.

According to an embodiment, there is provided a method to clean one or more optical elements of the lithography apparatus, wherein the cleaning method comprises cleaning one or more first optical elements Il1, IL2, IL3 of a sequence of optical elements, which receive a relatively high (first) radiation dose during operation of the apparatus, utilizing a cumulatively longer cleaning period than one or more second optical elements IL4, PS1-$PS_N$ of the sequence that receive a lower (second) radiation dose during operation of the apparatus. Herein, the cleaning period may be longer as measured cumulatively over an operational lifetime of the apparatus, for example over at least 1 year or over a plurality of years.

In other words, the cleaning method comprises cleaning one or more second optical elements IL4, PS1-$PS_N$ of the sequence, which receive a relatively low (second) radiation dose during operation of the apparatus, utilizing a cumulatively shorter cleaning period than a cumulative cleaning period applied to one or more first optical elements Il1, IL2, IL3 of the sequence that receive a higher (first) radiation dose during operation of the apparatus.

For example, the optical elements IL4, PS1-$PS_N$ that receive a second, lower radiation dose may be cleaned less often than the first optical elements IL1, IL2, IL3 that receive a first, high radiation dose, such that there is provided a cumulatively shorter cleaning period. Thus, a first optical element may be cleaned utilizing a relatively long cleaning period as such (and thus, a second optical element may be cleaned utilizing a relatively short cleaning period as such, the short cleaning period being much shorter than the long cleaning period applied to the first optical element). An advantage is that the cleaning may be carried out more swiftly in this manner. Additionally or alternatively, since the second optical elements IL4, PS1-$PS_N$ are cleaned less often and/or during a relatively short time period, or not at all (i.e., the respective cumulative cleaning period for each of the second optical elements IL4, PS1-$PS_N$=0 seconds), chances of any cleaning related degradation of those second optical elements IL4, PS1-$PS_N$ may be reduced or minimized (or, may be tolerated since less optical elements are involved), thus lengthening the operational lifetime of those elements IL4, PS1-$PS_N$ of the apparatus. The present embodiment may provide relatively long time intervals between overall apparatus cleaning sequences.

For example, in an embodiment, each second optical element is located downstream with respect of a first optical element, viewed along the optical path of the radiation beam. As in FIG. 1, the apparatus may comprise a support structure constructed to hold a patterning device MA in a certain patterning device position in the path of the radiation beam, wherein all first optical elements IL1, IL2, IL3 are located upstream with respect to the patterning device position, viewed with respect to a direction of propagation of the radiation beam, wherein at least a number of the second optical elements PS1-$PS_N$ are located downstream with respect to the patterning device position.

An embodiment of the invention is based on the notion that different optical elements receive different amounts of radiation (for example, EUV radiation) and that the contamination rate of an optical element may depend on the radiation dose received by the optical element. Particularly, the contamination rate may scale substantially linearly with the radiation dose, probably since the radiation promotes or induces contaminants (present in the interior space of the apparatus) to decompose and/or to bond to and/or react with the optical elements. Also, in an embodiment, contamination behavior may be dependent on the spectrum of the radiation. For example, as follows from the above, the contamination growth may scale with or be dependent on the ratio of EUV radiation in the radiation beam (for example the ratio of EUV radiation with respect to a higher wavelength Deep Ultra Violet (DUV) radiation). Thus, for example, in an embodiment, the method may comprise cleaning one or more second optical elements of the sequence, which receives a second radiation dose of a predetermined part of the spectrum during operation of the apparatus, utilizing a cumulatively shorter cleaning period than one or more first optical elements of the sequence, which receives a first radiation dose of the predetermined part of the spectrum during operation of the apparatus, the second radiation dose being lower than the first radiation dose. As an example, the above-mentioned predetermined part of the spectrum may comprise the EUV part of the spectrum.

It is believed that no one has perceived that a cleaning strategy of the optical elements of the apparatus may be adapted in a simple manner to make use of these notions. Thus, in the past, all optical elements of the apparatus were cleaned using substantially the same cleaning periods for each of the elements. Particularly, in the past, it was assumed that contamination growth on, for example, EUV mirrors is independent of the mirror location in the optical path and independent of radiation intensity, so that a similar contamination growth on each mirror was expected. Consequently this would lead to cleaning of each mirror with equivalent cleaning times. Furthermore, the lifetime budget, i.e. irreversible reflection loss, had to be distributed homogenously among each mirror of the optical column. Thus, cleaning methods in the past had been relatively complex and time-consuming compared to the one or more embodiments of cleaning methods described herein. Further, since all optical elements of the sequence were cleaned in past methods, the lifetimes of the optical elements were shortened considerably, thus leading to high maintenance and replacement cost. This may be avoided by one or more embodiments of the invention.

In an embodiment, the cleaning system, 10, 20, 50 may be specifically adapted to carry out one or more of the above-described cleaning methods. For example, the controller 50 may be programmed to control the cleaning units 10, 20 such that the desired cleaning strategy is carried out, for example such that only one or some of the optical elements that are arranged in the path of a radiation beam are cleaned depending on the amount of radiation received by each of those elements during the lithography process.

In an embodiment, the cleaning system may comprise or be coupled to a radiation loss detector that is configured to detect a radiation loss of radiation passing the illumination system IL and projection system PS of the apparatus. Then, the cleaning system 10, 20, 50 may be adapted to automatically start a cleaning cycle to clean, for example, at least one element of the illumination system IL when a detected radiation loss reaches a certain amount of radiation loss. For example, only the illuminator optical elements IL1, IL2, IL3 may be cleaned.

In an embodiment, the cleaning system 10, 20, 50 may comprise or be coupled to a contamination detector 53 that is configured to detect contamination of at least one optical element IL2 of the illumination system IL (and/or at least one optical element of the projection system PS), wherein the cleaning system 10, 20, 50 is adapted to automatically start a cleaning cycle to clean a number of the optical elements, arranged in the radiation beam path, when the detector 53 detects that contamination of an optical element has reached a certain amount of contamination. The contamination detector 53 may be configured in any of various ways and may be arranged to detect contamination of the optical element IL2 optically, electrically, using a detector signal or beam, by detecting secondary electron emission or reflectivity loss and/or in any different manner, depending on, among other factors, the type of optical element, as will be appreciated by the skilled person.

For example, a lithographic device manufacturing method may comprise projecting a beam of radiation onto a target portion of a substrate utilizing a sequence of optical elements, wherein the optical elements receive different radiation doses and contamination rates of the optical elements are correlated (for example substantially linearly) with the radiation doses. The method further includes a number of cleaning cycles to clean an optical element of the sequence, each cleaning cycle involving cleaning the optical element in dependence on the radiation dose received thereby, so that an optical element IL4, PS1-PS$_N$ that has received a second relatively low radiation dose is cleaned during a shorter time period or less often than another optical element IL1, IL3, IL3 that has received a first radiation dose higher than the second radiation dose. In an embodiment, for example, the above-mentioned first radiation dose may be in the range of 10-100% of the initial radiation dose received by the first optical element IL1 of the illuminator system IL, or in the range of 1-100% of the initial radiation dose, or in the range of 0.5-100% of the initial radiation dose. For example, the above-mentioned second radiation dose may be less than 10% of the initial radiation dose received by the first optical element IL1, or less than 1% of the initial radiation dose, or less than 0.5% of the initial radiation dose. Further, in an embodiment, the above-mentioned radiation doses may relate to a specific part of the spectrum (or spectral band), for example the EUV band.

In an embodiment, the method may comprise the applying of any of various cleaning cycles between lithography operating periods of the apparatus, wherein during one or more of the cleaning cycles only the one or more first optical elements IL1, IL2, IL3 of the sequence are being cleaned, and not the one or more second optical elements of the sequence. Thus, an advantageous cleaning strategy may involve not cleaning the second optical elements at all during a long time period, for example during one or several months, but still cleaning the first optical elements IL1, IL2, IL3 a number of times during such a long time period.

For example, a first optical element IL1 of the sequence of optical elements, which is part of an illuminator, may be cleaned at least 10 times more often than a second optical element PS1-PS$_N$ of the sequence optical elements, the second element being part of a downstream projection system PS of the apparatus. In an embodiment, the cleaning system 10, 20, 50 is configured to clean one or more optical elements of the projection system of the apparatus for a cumulatively 100 times shorter cleaning period, or at 100 times less often or never, than one or more optical elements of the illumination system of the apparatus (particularly measured over a relatively long period of one or more years).

In an embodiment, the cleaning method may comprise:
providing (for example detecting or calculating) radiation dose information, the information including or relating to the amount of radiation each of one or more optical elements IL1-IL4, PS1-PS$_N$ receives during operation of the apparatus; and providing a cleaning period for cleaning one or more of the optical elements IL1-IL4, PS1-PS$_N$, such that a length of the cleaning period concerning an optical element is correlated to the respective radiation dose information of that optical element.

For example, the correlation may be a substantially linear correlation, wherein the cleaning period to be applied to a certain optical element of the sequence scales substantially positively linearly with a radiation dose received by that element during a lithography process. Alternatively, or in addition, the correlation may be a binary correlation, wherein the cleaning period to be applied to a certain optical element of the sequence has a length t=T seconds when that element receives the above-mentioned high radiation dose during a lithography process, but has a length t=0 seconds if that element receives the above-mentioned low radiation dose during the lithography process. Also, any of a number of other types of correlation may be applied, as will be appreciated by the skilled person.

As an example, the memory 51 of the cleaning system 50 may hold one more of:

radiation information including or relating to the amount of radiation one or more of the optical elements of the apparatus receives during operation of the apparatus; and a cleaning period for cleaning each of one or more the optical elements, the length of the cleaning period concerning an optical element being correlated to the respective radiation dose information of that optical element, and a cleaning rate of a cleaning process for cleaning each of one or more optical elements, wherein the cleaning system is configured to use the radiation information, or the cleaning period, or cleaning rates, or any combination of the foregoing, to clean one or more optical elements during a respective cleaning cycle.

For example, in an embodiment, a cleaning method may include detecting contamination of one or more optical elements IL1-IL4, PS1-PS$_N$, or measuring a radiation intensity loss of a radiation beam subsequently passing one or more optical elements, or both, wherein the first optical element IL1-IL3 may be cleaned in the case when:

one or more optical elements IL1-IL4, PS1-PS$_N$ has reached a certain contamination threshold; and/or a radiation intensity loss of a radiation beam subsequently passing one or more optical elements has reached a certain threshold.

Figure 3:
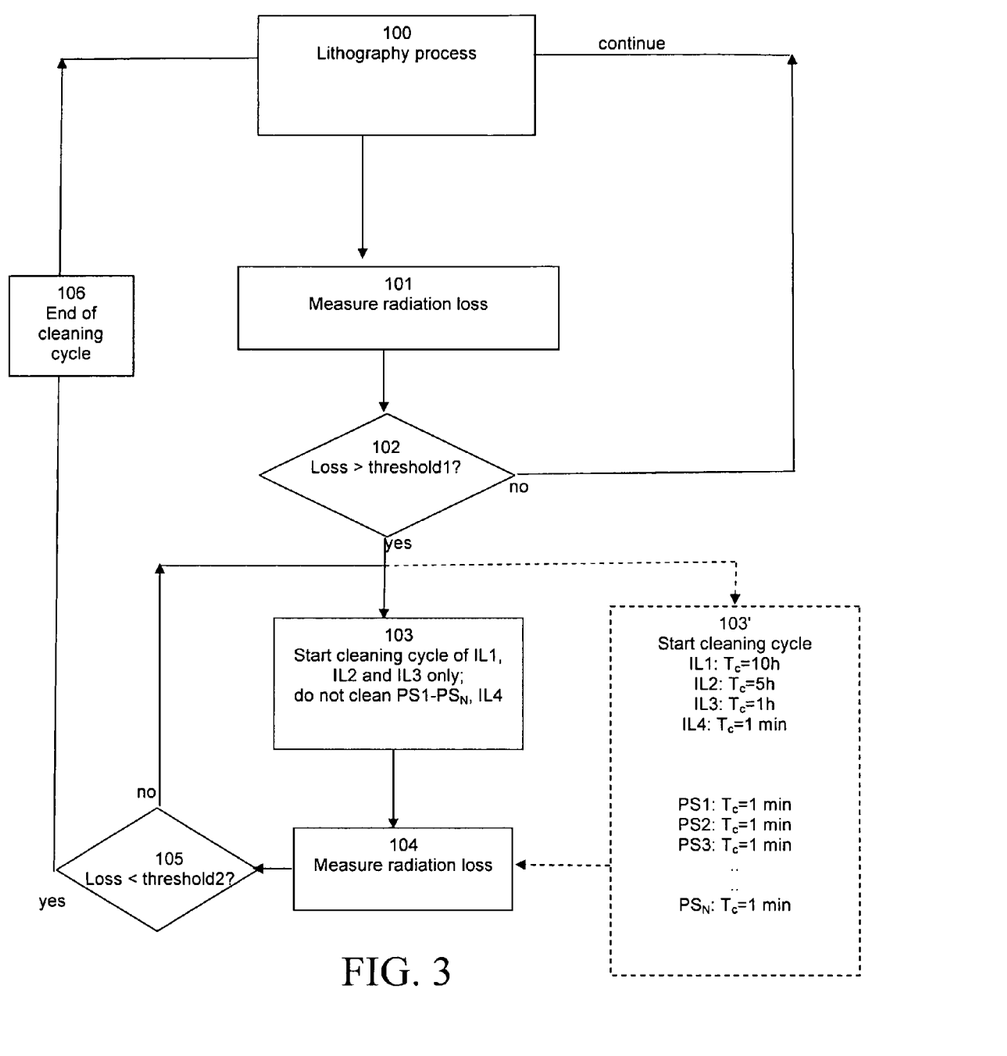
FIG. 3 schematically depicts a flow chart of an embodiment of a cleaning method.

FIG. 3 shows a flow chart of an embodiment, wherein a lithographic process 100 is carried out, for example by an apparatus shown in FIG. 1. Part of the process 100 may involve measuring radiation loss through the sequence of optical elements IL1-IL4, PS1-PS$_N$ of the lithography system (step 101), for example a loss through only one of these optical elements or a loss concerning all of these optical elements.

Then, it is determined whether or not the radiation loss has reached a certain threshold value 'threshold1' (step 102). In the case that this contamination threshold value has indeed been reached, the lithography process may be interrupted and one or more cleaning cycles 103 may be started. Herein, only the optical elements of the sequence are cleaned that have received a large radiation dose during the lithography process, for example one or more optical elements IL1, IL2, IL3 of the illumination system IL.

After a first cleaning cycle 103, desirably, the radiation loss is measured again (step 104) and compared with a second threshold value 'threshold2' (step 105). The cleaning cycle 103 may be repeated in the case that a desired low radiation loss has not yet been achieved by a previous cleaning cycle. In the case that a desired low radiation loss has been reached (i.e., loss<threshold2), the lithography process may be started (via step 106).

FIG. 3 also shows an alternative cleaning cycle 103', in which first optical elements IL1-IL3 are cleaned much longer than second optical elements IL4, PS1-PS$_N$ (i.e. the second optical elements IL4, PS1-PS$_N$ are cleaned within a much shorter time period than the first optical elements IL1-IL3). As an example, some of the illuminator optical elements IL1-IL3 are cleaned during at least an hour, and the remaining elements IL4, PS1-PS$_N$ are only cleaned during a much shorter time period of one or several minutes. For example, the first illuminator optical element IL1 is cleaned much longer (at least 2 times longer, e.g., 10 hours) than the second illuminator optical element IL2 (e.g., 5 hours), and the second illuminator optical element IL2 is cleaned longer (at least 2 times longer) than the third illuminator optical element IL3 (e.g., 1 hour). Naturally, the length of a cleaning period regarding each element depends on the type of contamination and cleaning rate of a respective cleaning method applied to the element. For example, this alternative step 103' may make use of above-mentioned information that includes or relates to the amount of radiation one or more optical elements IL1-IL4, PS1-PS$_N$ of the apparatus receives during operation of the apparatus, such that the length of the cleaning period concerning an optical element is correlated to the respective radiation dose information of that optical element (see above).

Figure 4:
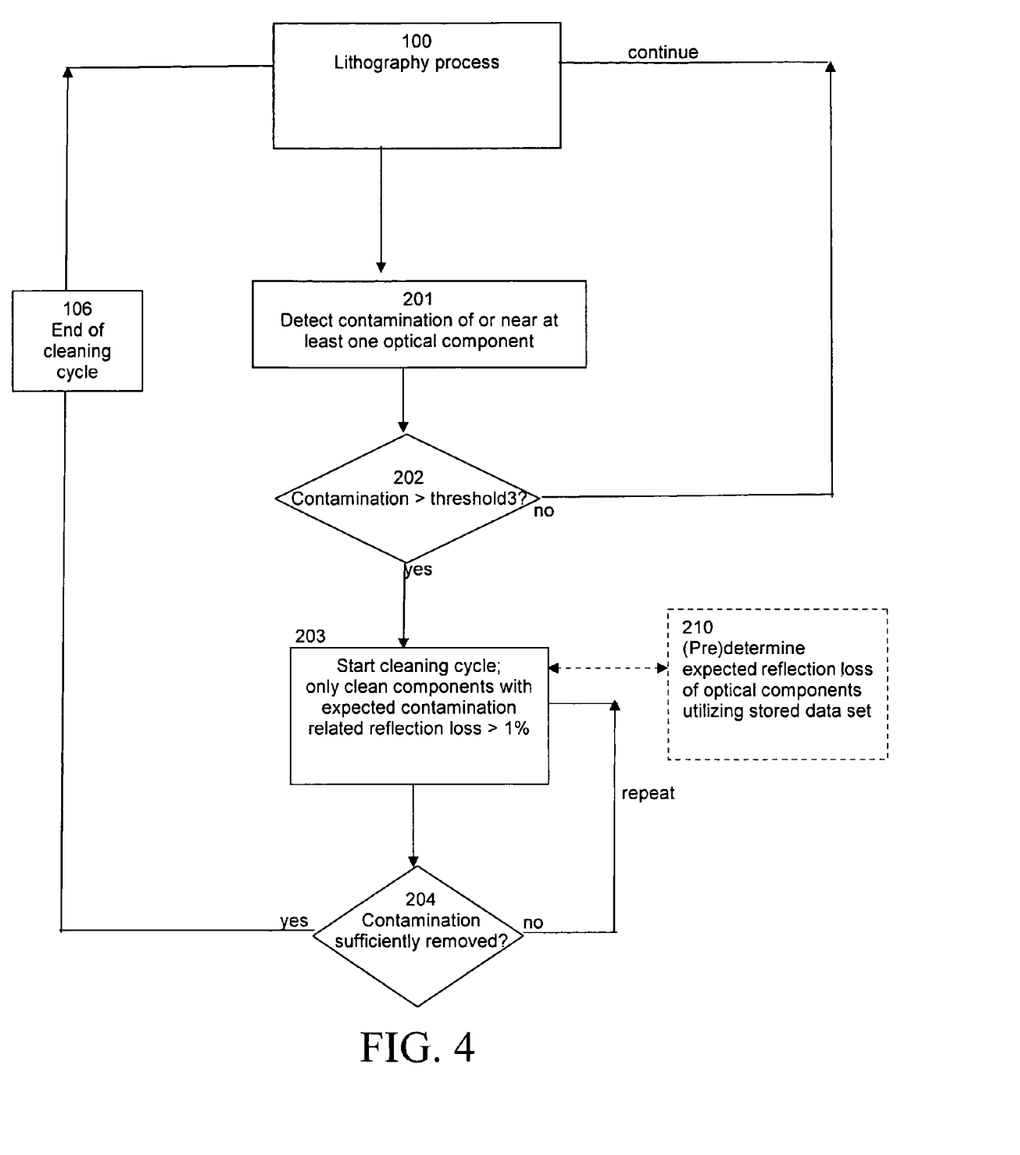
FIG. 4 schematically depicts a flow chart of another embodiment of a cleaning method.

FIG. 4 shows another flow chart, which differs from FIG. 3 in a step 201 is provided to detect contamination of or near one or more of the optical elements of the sequence. In the case that a detected contamination has exceeded a certain threshold value 'threshold3', a cleaning cycle is commenced. For example, the cleaning cycle may be similar to that described above concerning FIG. 3. In FIG. 4, an alternative cleaning cycle 203 is depicted, wherein only the optical elements of the sequence are cleaned that are expected to have experienced a contamination related optical loss (particularly a contamination related reflection loss, in the case that the optical elements are mirrors) of more than 1%. For example, an optional step 210 may be provided comprising utilizing a stored data set to determine the expected optical (reflection) loss of the optical elements. Particularly, such a data set (that may be stored in the controller memory 51) may have been pre-calculated or determined by experiment, and may include a certain amount of contamination of one or more of the optical elements IL1-IL4, PS1-PS$_N$ and/or a loss of radiation passing the sequence of optical elements IL1-IL4, PS1-PS$_N$. The data set may also comprise respective predetermined (calculated or by experiment) optical losses of the optical elements. Alternatively, in step 210, optical losses of the optical elements may be calculated or estimated using the information of the data set, and a predetermined (substantially linear) correlation between optical loss by the optical element, contamination of that element and radiation dose received by that element.

After a cleaning cycle 203, an optional verification step 204 may be carried out to determined whether the contamination has been removed to a sufficient degree. Alternatively or in addition, steps 104-105 may be carried out to detect radiation loss regarding one or more optical elements of the sequence.

An embodiment of the method may provide short machine downtime, i.e. the time in which no illumination may be performed, since the time required for each cleaning step as well as the number of needed cleaning cycles may be reduced considerably over the lifetime of the optical system of the apparatus. Also, a time interval in between cleanings may be relatively long. A further benefit may be that high intensity illuminated mirrors may be cooled during operation; this makes cleaning easier since this cooling may be applied during cleaning which makes the recovery time after cleaning smaller. Further, since cleaning might also introduce negative effects to the reflectivity of the optics (e.g. a little metal deposition each time the mirror is cleaned, depending on the cleaning process), the reduction in required number of cleaning cycles may result in a higher lifetime of the optical system.

In an embodiment, as follows from the above, a cleaning strategy may be provided for an EUV optical system based on an intensity dependence of contamination growth on EUV mirrors under illumination with EUV photons under a specified (dominated by water and hydrocarbon partial pressure)

vacuum environment. For example, a primary contaminant to be removed may be carbon contamination. For example, within the optical column of an EUV lithography system, the radiation intensity (for example of EUV radiation) may drop from 100% on the first mirror IL1 of the illumination system to approx. 0.01% on the last mirror $PS_N$ of the projection system. The contamination process during illumination with pulsed photons under specified vacuum conditions (dominated by water and hydrocarbon partial pressure) may be highly dominated by EUV induced carbon growth which in addition may be highly intensity dependent (e.g., a linear dependence of carbon growth with intensity). Therefore, following this notion, it may be expected that the contamination growth within an EUV lithography system may also differ from mirror to mirror leading to thicker carbon layers on the first, high intensity mirrors IL1-IL3 compared to the last, low intensity mirrors of the projection system PS. Thus, in an embodiment, only the first three mirrors IL1-IL3 accumulate so much carbon that cleaning processes are necessary to be performed. The carbon contamination on all the other mirrors may be neglected more or less. Additionally, the number of required cleaning cycles on these first three mirrors IL1-IL3 may be reduced because the total available lifetime budget, i.e. irreversible reflection loss budget, only needs to be distributed over three mirrors instead of all mirrors IL1-IL3, PS1-$PS_N$.

One or more embodiments of the invention may provide one or more various merits. For example, the number of cleaning cycles may be reduced considerably and/or cleaning times may be reduced. Optics lifetime may be enhanced and/or downtime of the system may be reduced. Since a more efficient cleaning scenario is implemented, one or more embodiment may provide cost significant reduction.

The above-mentioned first optical element may be located in any of various positions in the sequence of optical elements, for example in an upstream location, downstream location or there-between. The same holds for the above-mentioned second optical element.

Further, one or more embodiments have been described in relation to optical elements. One or more embodiments may additionally or alternatively be applied to one or more other non-optical elements of the lithography apparatus, such as one or more structures exposed to contamination and optionally radiation.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical elements, including refractive, reflective, magnetic, electromagnetic and electrostatic optical elements.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method to clean one or more optical elements of an apparatus, the apparatus being configured to project a beam of radiation onto a target portion of a substrate and comprising a plurality of optical elements arranged in a sequence in a path of the radiation beam, wherein the method comprises cleaning a second optical element of the sequence, which receives a second radiation dose during operation of the apparatus, utilizing a cumulatively shorter cleaning period than a first optical element of the sequence, which receives a first radiation dose during operation of the apparatus, the second radiation dose being lower than the first radiation dose, wherein the cleaning comprises (i) detecting a radiation loss of radiation passing one or more of the optical elements and automatically starting a cleaning cycle to clean at least one of the optical elements in the case a detected radiation loss reaches a certain amount of radiation loss, or (ii) detecting contamination of at least one of the optical elements and automatically starting a cleaning cycle to clean at least one of the optical elements when the contamination reaches a certain amount of contamination.

2. The method according to claim 1, wherein the second optical element is located downstream with respect to the first optical element, viewed along the path of the radiation beam.

3. The method according to claim 1, further comprising:
providing radiation dose information, the information including or relating to the amount of radiation the second optical element receives during operation of the apparatus; and
providing a cleaning period for cleaning the second optical element, such that the length of the cleaning period concerning the second optical element is correlated to the radiation dose information of the second optical element.

4. The method according to claim 1, comprising applying various cleaning cycles between operating periods of the apparatus, wherein during one or more of the cleaning cycles only the first optical element is being cleaned, and not the second optical element.

5. The method according to claim 1, wherein the apparatus comprises a support structure constructed to hold a patterning device at a patterning device position in the path of the radiation beam, wherein the first optical element is located upstream with respect to the patterning device position and the second optical element is located downstream with respect to the patterning device position, viewed with respect to a direction of propagation of the radiation beam.

6. The method according to claim 1, wherein the first radiation dose and the second radiation dose comprise EUV radiation.

7. The method of claim 1, wherein the cleaning comprises the detecting the radiation loss of radiation passing one or more of the optical elements and automatically starting a cleaning cycle to clean at least one of the optical elements in the case a detected radiation loss reaches a certain amount of radiation loss.

8. The method of claim 1, wherein the cleaning comprises the detecting contamination of at least one of the optical elements and automatically starting a cleaning cycle to clean at least one of the optical elements when the contamination reaches a certain amount of contamination.

9. A device manufacturing method, comprising:
projecting a beam of radiation onto a target portion of a substrate utilizing a sequence of optical elements, wherein the optical elements receive different radiation doses and the contamination rates of the optical elements are correlated with the radiation doses;
executing a number of cleaning cycles to clean at least one of the optical elements, each cleaning cycle involving cleaning an optical element of the sequence based on the radiation dose received by the optical element, so that an optical element that has received a low radiation dose is cleaned during a shorter time period or less often than an optical element that has received a radiation dose that is higher than the low radiation dose, wherein executing the number of cleaning cycles comprises (i) detecting a radiation loss of radiation passing one or more of the optical elements and automatically starting a cleaning cycle to clean at least one of the optical elements in the case a detected radiation loss reaches a certain amount of radiation loss, or (ii) detecting contamination of at least one of the optical elements and automatically starting a cleaning cycle to clean at least one of the optical elements when the contamination reaches a certain amount of contamination.

10. The method according to claim 9, wherein a second optical element of the sequence of optical elements, the second optical element being part of a projection system of a lithographic apparatus used to project the beam of radiation, is being cleaned at least 10 times less often than a first optical element of the sequence of optical elements, the first optical element being part of an illuminator of the lithographic apparatus.

11. The method according to claim 9, wherein the optical element that has received the radiation dose that is higher than the low radiation dose is located upstream with respect to a patterning device in the path of the radiation beam and the optical element that has received the low radiation dose is located downstream with respect to the patterning device, viewed with respect to a direction of propagation of the radiation beam.

12. The method of claim 9, wherein the executing the number of cleaning cycles comprises the detecting the radiation loss of radiation passing one or more of the optical elements and automatically starting a cleaning cycle to clean at least one of the optical elements in the case a detected radiation loss reaches a certain amount of radiation loss.

13. The method of claim 9, wherein the executing the number of cleaning cycles comprises the detecting contamination of at least one of the optical elements and automatically starting a cleaning cycle to clean at least one of the optical elements when the contamination reaches a certain amount of contamination.

14. An apparatus, comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate; and
a cleaning system configured to clean one or more optical elements of the apparatus, the cleaning system being configured to clean an optical element of the projection system during a cumulatively shorter cleaning period than an optical element of the illumination system, the cleaning system comprising or being, in use, coupled to (i) a radiation loss detector configured to detect a radiation loss of radiation passing one or more of the optical elements and wherein the cleaning system is configured to automatically start a cleaning cycle to clean the optical element of the projection system, the optical element of the illumination system, or both, in the case a detected radiation loss reaches a certain amount of radiation loss, or (ii) a contamination detector configured to detect contamination of the optical element of the projection system, the optical element of the illumination system, or both, and wherein the cleaning system is configured to automatically start a cleaning cycle to clean the optical element of the projection system, the optical element of the illumination system, or both, when the contamination reaches a certain amount of contamination.

15. The apparatus according to claim 14, wherein the cleaning system is configured to clean only one or some of the optical elements that are arranged in the path of the radiation beam, depending on the amount of radiation received by each of such elements during the projection of the patterned beam.

16. The apparatus according to claim 14, further comprising a memory holding (i) radiation information including or relating to the amount of radiation one or more of the optical elements receives during operation of the apparatus, or (ii) a cleaning period for cleaning one or more of the optical elements, the length of the cleaning period concerning an optical element being correlated to the respective radiation dose information of that optical element, or (iii) a cleaning rate of a cleaning process for cleaning one or more of the optical elements, or (iv) any combination of (i)-(iii), wherein the cleaning system is configured to use the radiation information, or the cleaning period, or the cleaning rate, or any combination thereof, to clean the optical element of the projection system, the optical element of the illumination system, or both.

17. The apparatus according to claim 14, comprising or being coupled to the radiation loss detector and wherein the cleaning system is configured to automatically start a cleaning cycle to clean the optical element of the projection system, the optical element of the illumination system, or both, in the case a detected radiation loss reaches a certain amount of radiation loss.

18. The apparatus according to claim 14, comprising or being coupled to the contamination detector and wherein the cleaning system is configured to automatically start a cleaning cycle to clean the optical element of the projection system, the optical element of the illumination system, or both, when the contamination reaches a certain amount of contamination.

19. The apparatus according to claim 14, configured to clean the optical element of the projection system at least 10 times less often than the optical element of illumination system.

20. A cleaning system adapted to clean one or more optical elements of an apparatus, the optical elements being arranged in a path of a radiation beam used during a process carried out by the apparatus, wherein the cleaning system is configured to clean only one or some of the optical elements that are arranged in the path of the radiation beam, depending on the amount of radiation received by each of such elements during the process, the cleaning system comprising or being, in use, coupled to (i) a radiation loss detector configured to detect a radiation loss of radiation passing one or more of the optical elements and wherein the cleaning system is configured to automatically start a cleaning cycle to clean at least one of the optical elements in the case a detected radiation loss reaches a certain amount of radiation loss, or (ii) a contamination detector configured to detect contamination of at least one of the optical elements and wherein the cleaning system is configured to automatically start a cleaning cycle to clean at least one of the optical elements when the contamination reaches a certain amount of contamination.

21. The cleaning system according to claim 20, further comprising a memory holding (i) radiation information including or relating to the amount of radiation one or more of the optical elements receives during operation of the apparatus, or (ii) a cleaning period for cleaning one or more of the optical elements, the length of the cleaning period concerning an optical element being correlated to the respective radiation dose information of that optical element, or (iii) a cleaning rate of a cleaning process for cleaning one or more of the optical elements, or (iv) any combination of (i)-(iii), wherein the cleaning system is configured to use the radiation information, or the cleaning period, or the cleaning rate, or. any combination thereof, to clean the one or some optical elements.

22. The cleaning system according to claim 20, comprising or being coupled to the radiation loss detector and wherein the cleaning system is configured to automatically start a cleaning cycle to clean at least one of the optical elements in the case a detected radiation loss reaches a certain amount of radiation loss.

23. The cleaning system according to claim 20, comprising or being coupled to the contamination detector and wherein the cleaning system is configured to automatically start a cleaning cycle to clean at least one of the optical elements when the contamination reaches a certain amount of contamination.

24. The cleaning system according to claim 20, configured to clean one or more of the optical elements during a cumulatively 100 times shorter cleaning period than one or more other of the optical elements.

25. The cleaning system according to claim 20, configured to clean only one or some of the optical elements that are arranged in the path of the radiation beam, depending on the amount of EUV radiation received by each of such elements during the process.

\* \* \* \* \*